United States Patent
Fuchs et al.

(10) Patent No.: US 8,237,428 B2
(45) Date of Patent: Aug. 7, 2012

(54) METHOD FOR DETECTING AN ELECTRIC POTENTIAL-DIFFERENCE AT A PIEZOELECTRIC ACTUATOR UNIT, AND A CIRCUIT SYSTEM FOR IMPLEMENTING THE METHOD

(75) Inventors: Stefan Fuchs, Stuttgart (DE); Marco Graf, Ditzingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 12/308,302

(22) PCT Filed: Mar. 12, 2008

(86) PCT No.: PCT/EP2008/052914
§ 371 (c)(1),
(2), (4) Date: Jun. 28, 2011

(87) PCT Pub. No.: WO2008/116750
PCT Pub. Date: Oct. 2, 2008

(65) Prior Publication Data
US 2011/0248701 A1  Oct. 13, 2011

(30) Foreign Application Priority Data
Mar. 26, 2007  (DE) .......................... 10 2007 014 329

(51) Int. Cl.
*G01R 1/38* (2006.01)
(52) U.S. Cl. ....................................... 324/115; 324/114

(58) Field of Classification Search .................. 324/115, 324/114, 76.13–76.18
See application file for complete search history.

(56) References Cited

U.S. PATENT DOCUMENTS

| | | | | |
|---|---|---|---|---|
| 6,037,891 A | * | 3/2000 | Griph ............................ | 341/161 |
| 2002/0180988 A1 | * | 12/2002 | Johnston et al. ............... | 356/602 |
| 2005/0231212 A1 | * | 10/2005 | Moghissi et al. .............. | 324/606 |
| 2007/0115009 A1 | * | 5/2007 | Graefling ....................... | 324/721 |
| 2007/0223634 A1 | * | 9/2007 | Haddad et al. ................ | 375/355 |

FOREIGN PATENT DOCUMENTS

| DE | 10 2004 037720 | 3/2006 |
|---|---|---|
| DE | 10 2004 058671 | 6/2006 |

* cited by examiner

*Primary Examiner* — Huy Q Phan
*Assistant Examiner* — Temilade S Rhodes-Vivour
(74) *Attorney, Agent, or Firm* — Kenyon & Kenyon LLP

(57) ABSTRACT

A circuit system for detecting a time-variable amplitude via an electric potential-difference to be detected. A first potential-difference detection device for detecting the at least one electric potential-difference and for outputting a first potential-difference signal, and a second potential-difference detection device for detecting the at least one electric potential-difference and for outputting a second potential-difference signal are provided. The first potential-difference detection device has a higher time resolution than the second potential-difference detection device, while the second potential-difference detection device has a higher amplitude resolution than the first potential-difference detection device.

9 Claims, 1 Drawing Sheet

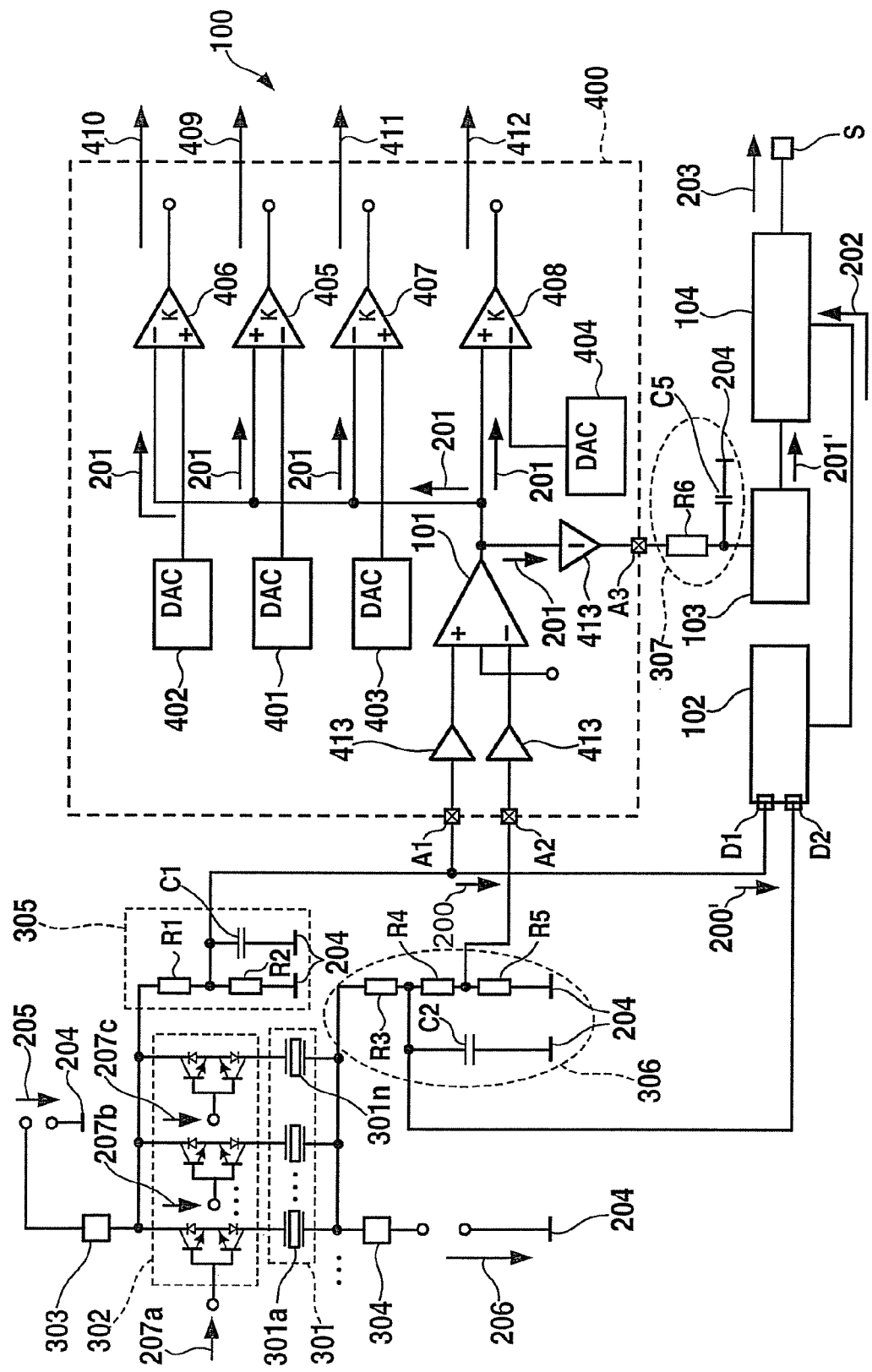

METHOD FOR DETECTING AN ELECTRIC POTENTIAL-DIFFERENCE AT A PIEZOELECTRIC ACTUATOR UNIT, AND A CIRCUIT SYSTEM FOR IMPLEMENTING THE METHOD

FIELD OF THE INVENTION

The present invention relates to a circuit system for driving a piezoelectric element, and in particular relates to a circuit system and a method for monitoring the piezoelectric element. Specifically, the present invention relates to a circuit system for detecting a time-variable amplitude of at least one electric potential-difference to be detected, having a first potential-difference detection device for detecting the at least one electric potential-difference and for outputting a first potential-difference signal, and a second potential-difference detection device for detecting the at least one electric potential-difference and for outputting a second potential-difference signal.

BACKGROUND INFORMATION

Control devices for piezoelectric elements are used in fuel injection systems of a motor vehicle, for example. In this connection, piezoelectric elements of this type are used as an actuator to which a control current may be applied. For the control of such an actuator, the voltage applied to the actuator must be monitored with high precision.

The operativeness of injection systems for internal combustion engines is based on an exact control of the fuel-injection actuators that are designed as piezo actuators. In DE 10 2004 037 720 A1, a control circuit for an actuator is discussed, piezoelectric elements being controlled that move a valve needle of an injection valve, for example, in order to bring about a fuel injection into a combustion chamber of the internal combustion engine.

The control circuit discussed in DE 1 037 720 A1 is designed such that interference currents, which occur as a result of lead inductances of the piezoelectric elements at specified current characteristics, are avoided to the greatest possible extent.

German patent document DE 10 2004 058 671 A1 discusses an additional electric circuit for controlling a piezoelectric element in particular of a fuel injection system of a motor vehicle. In this connection, two transistors, which are connected in series and are controllable using one pulse, are provided whose shared connecting point is coupled to the piezoelectric element and of which one is provided for discharging the piezoelectric element. Indeed, in the case of an error, a fast discharge of the piezoelectric element may be ensured; however, disadvantageously, using the described system it is not possible to monitor a voltage at the piezoelectric element reliably and without ground potential.

In order to be able to introduce fuel into a combustion chamber using a piezoelectric element, the piezoelectric element must be charged to a voltage of up to 200 V. A charging/discharging of the piezoelectric element (the actuator unit) is done using a pulsed current. In customary common rail piezo diesel systems, one pole of the piezoelectric element is connected to the ground potential. Thus, to measure the actuator voltage, potential at the other end of the piezoelectric element may be detected and determined relative to ground.

However, in the further refinement of piezoelectric elements for highly precise fuel injection, none of the terminals of the piezoelectric element is connected to ground. Rather, the piezoelectric element is not only able to be charged to a positive voltage, but also to a slightly negative voltage. To this end, one pole of the piezoelectric element (low voltage side) is set to a voltage of approximately 45 V with respect to ground. It is problematic if such a potential of less than 45 V is also applied to a terminal on the high voltage side, since then the differential voltage at the actuator becomes negative. In order to be able to use and monitor such piezoelectric elements, a ground-potential-free measurement of the differential voltage must be provided.

SUMMARY OF THE INVENTION

A basis of the exemplary embodiments and/or exemplary methods of the present invention is thus the problem of providing a reliable, highly-resolved, in terms of time and amplitude, measurement of the differential voltage at a piezoelectric actuator.

To achieve this objective, the exemplary embodiments and/or exemplary methods of the present invention provides a circuit system for detecting a time-variable amplitude of at least one electric potential-difference to be detected, having the features described herein. Furthermore, a method for detecting a time-variable amplitude of at least one electric potential-difference to be detected is specified, which method has the steps contained also described herein. Advantageous refinements of the present invention are also described herein.

An aspect of the exemplary embodiments and/or exemplary methods of the present invention is to provide two different potential-difference detection devices for detecting the at least one electric potential-difference and for outputting potential-difference signals, a first potential-difference detection device having a higher time resolution than a second potential-difference detection device, and the second potential-difference detection device having a higher amplitude resolution than the first potential-difference detection device.

Using such a device for monitoring differential voltage, it is possible to reliably monitor piezoelectric elements that are used in piezo common rail diesel systems having an injector with a direct needle control, for example. Advantageously, a processing device processes the first and second potential-difference signals in such a manner that a control signal having a high amplitude resolution and/or a high time resolution is obtained.

An aspect of the exemplary embodiments and/or exemplary methods of the present invention is that the first potential-difference detection device is designed such that it determines the first potential-difference signal in an analog manner, while at least one second potential-difference detection device is designed such that it determines the second potential-difference signal in a digital manner.

According to one general aspect, the circuit system for the detecting a time-variable amplitude of at least one electric potential-difference according to the present invention essentially has:

a) a first potential-difference detection device for detecting the at least one electric potential-difference and for outputting a first potential-difference signal; and b) at least one second potential-difference detection device for detecting the at least one electric potential-difference and for outputting a second potential-difference signal, the first potential-difference detection device having a higher time resolution than the second potential-difference detection device, and the second potential-difference detection device having a higher amplitude resolution than the first potential-difference detection device.

Furthermore, the method according to the present invention for detecting a time-variable amplitude of at least one electric potential-difference to be detected has essentially the following steps:

a) detecting the at least one electric potential-difference using a first potential-difference detection device;
b) outputting a first potential-difference signal from the first potential-difference detection device;
c) detecting the at least one electric potential-difference using a second potential-difference detection device; and
(d) outputting a second potential-difference signal from the second potential-difference detection device, the first potential-difference detection device detecting the electric potential-difference at a higher time resolution than the second potential-difference detection device, and the second potential-difference detection device detecting the electric potential-difference at a higher amplitude resolution than the first potential-difference detection device.

Advantageous further refinements and improvements to the respective subject matter of the present invention are set forth herein.

According to one further refinement of the present invention, the first potential-difference detection device is designed such that the first potential-difference signal is determined in an analog manner.

According to another further refinement of the present invention, the second potential-difference detection device is designed such that the second potential-difference signal is determined in a digital manner.

An analog-digital converter may be connected downstream from the first potential-difference detection device.

According to yet another refinement of the present invention, a processing device for processing the first potential-difference signal and the second potential-difference signal is provided, the processing device outputting a control signal that has a high amplitude resolution and/or a high time resolution.

One exemplary embodiment of the present invention is represented in the drawing and explained in greater detail in the following description.

BRIEF DESCRIPTION OF THE DRAWING

FIG. 1 shows a block diagram of a circuit system for detecting a time-variable amplitude of at least one electric potential-difference to be detected, having first and second potential-difference detection devices in accordance with one exemplary embodiment of the present invention.

DETAILED DESCRIPTION

FIG. 1 shows a block diagram of a circuit system for detecting a time-variable amplitude of at least one potential-difference 200 to be detected in accordance with one exemplary embodiment of the present invention. Circuit system 100 shown in FIG. 1 has a control device 400 for providing switching control signals 409-412, which may be generated as a function of a potential-difference signal.

In accordance with the exemplary embodiment of the present invention shown in FIG. 1, circuit system 100 is used to monitor the differential voltage at an actuator unit 301. Actuator unit 301 is controlled via an actuator control unit 302, actuator control unit 302 receiving externally specified actuator control signals 207a, 207b, 207c. To operate actuator unit 301, a first actuator supply voltage 205 with respect to a ground potential 204 is applied at a first supply voltage terminal 303, and a second actuator supply voltage 206 with respect to ground potential 204 is applied at a second supply voltage terminal 304.

Actuator unit 301 is made up of individual actuator units 301a-301n (in FIG. 1, three individual actuator units are illustrated), which may be piezoelectric actuating elements. Such piezoelectric actuating elements or piezo actuators may be made up of thin piezoelectric crystal plates, which expand in an electric field. Compared to magnetically driven valves, piezoelectric actuating elements may provide operating speeds that are up to five times faster for a fuel injection into the combustion chamber of an internal combustion engine. In this context, the piezoelectric actuating elements act on a valve needle of an injection valve, in order to bring about the fuel injection into the combustion engine of the internal combustion engine.

With reference to FIG. 1, the detection of the differential voltage, which is applied at actuator units 301a-301n, between the terminal units (not shown) of a respective actuator unit 301a-301n is explained. In order to be able to use a piezoelectric actuator unit 301a-301n to introduce fuel into the combustion chamber of the internal combustion engine, piezoelectric actuator unit 301a-301n must be charged to a voltage of up to 200 V with regard to ground. A pulsed current is used to charge/discharge such a piezoelectric actuator unit 301a-301n. More recently, actuator units 301a-301n were developed, in which one pole (one terminal unit) of the piezoelectric actuator unit is not at ground potential 204. In this way, it is not possible for the voltage applied across the piezoelectric actuator unit to be measured via the measurement at the energized pole (the energized terminal unit) of the piezoelectric actuator unit 301a-301n, as described above with reference to the related art.

Instead, according to the exemplary embodiments and/or exemplary methods of the present invention, a measurement is provided at both poles (terminal units) of piezoelectric actuator unit 301. To this end, a first voltage divider unit 305 for detecting first actuator supply voltage 205, and a second voltage divider unit 306 for measuring second actuator voltage supply 206 are provided. In the following, first actuator supply voltage 205 is also called an HS voltage (high-side voltage), while second actuator supply voltage 206 is also called an LS voltage (low-side voltage).

Thus, actuator units 301 are provided, which are not only able to be charged to a positive voltage (with respect to ground), but also to a slightly negative voltage. To this end, a terminal unit of the actuator unit is connected to an LS voltage of approximately 45 V with respect to ground potential 204. Thus, if the HS voltage (first actuator supply voltage 205) is reduced to below 45 V, the differential voltage at the terminal units of actuator unit 301 is negative.

Since the amplitude of the LS voltage (second actuator supply voltage) 206 fluctuates slightly during operation of a driver unit, to determine the voltage applied across actuator unit 301, it is necessary to measure not only the HS voltage, i.e., first actuator supply voltage 205, but also the LS voltage, i.e., second actuator supply voltage 206. Ultimately, a potential-difference 200 is determined from both measured voltages.

To this end, first and second actuator supply voltages 205, 206, which are in part provided with high voltage amplitudes, are supplied to first and second voltage divider units 305, 306. First and second voltage divider units 305, 306 provide the combination of a voltage division and filtering. In this connection, the voltage division takes place via a series connection of two ohmic resistors, while a low-pass filtering takes place via a series connection of an ohmic resistor and a capacitor.

First voltage divider unit 305 illustrated in FIG. 1 thus has a series connection of an ohmic resistor R1 and an ohmic resistor R2, which series connection is connected between first supply voltage terminal 303 and ground 204. A capacitor C1 is connected parallel to ohmic resistor R2. This divided and filtered first actuator supply voltage 205 is supplied on the one hand to a first input terminal A1 of control device 400 and on the other hand to a first input terminal D1 of a second potential-difference detection device.

Second voltage divider unit 306 has a series connection of three resistors R3, R4, and R5, which are connected between second supply voltage terminal 304 and ground 204. A capacitor C2 (smoothing capacitor) is connected in parallel to the series connection of resistors R4 and R5 in such a manner that a filter unit, made up of resistor R3 and capacitor C2, is provided. Second actuator supply voltage 206, which is divided by second voltage divider unit 306 and filtered, is supplied on the one hand to a second input terminal A2 of control device 400, input terminal A2 being connected to the connection point of resistors R4 and R5, and is supplied on the other hand to a second input terminal D2 of second potential-difference detection device 102, second input terminal D2 being connected to the connection point of resistors R3 and R4.

In this way, a potential-difference 200 is present between input terminals A1 and A2 of control device 400, while a different potential-difference 200' is present between input terminals D1 and D2 of second potential-difference detection device 102. Both potential-differences are used for determining the differential voltage applied at actuator units 301a-301n. In this context, second potential-difference detection device 102 is designed to determine a second potential-difference signal 202 digitally. Digitally determined second potential-difference signal 202, which is output from digital second potential-difference detection device 102, thus reflects a digital value of potential-difference 200'. Second potential-difference signal 202 is supplied to a processing device 104, which processes second potential-difference signal 202 with a first potential difference signal 201, whose generation is described in detail below.

Processing device 104 has a control terminal S, from which a control signal 203 is output as a function of the supplied first and second potential-difference signals 201, 202. Thus, as described in more detail below, processing device 104 may be used to process first potential-difference signal 201 and second potential-difference signal 202 to provide a control signal 203, which has a specifically predefined amplitude resolution and/or a specifically predefined time resolution.

Potential-difference 200, which is present at input terminals A1 and A2 of control device 400, is measured in an analog manner in a first potential-difference detection device 101. For this purpose, the inputs of a difference amplifier (+, −) are connected to inputs A1 and A2 of control device 400 via respective coupling units 413. The output signal, which is output from first potential-difference detection device 101, is an analog first potential-difference signal 201, which is output from control device 400 via an additional coupling unit 413 via an output terminal A3. Output A3 of control device 400 is connected to an analog-digital converter 103 via a resistor R6.

This analog-digital converter 103, which is downstream of first potential-difference detection device 101, converts first potential-difference signal 201, which is output from first potential-difference detection device 101, at a high speed into a digital first potential-difference signal 201'. This digitally converted first potential-difference signal 201' is also supplied to processing device 104. A capacitor C5 is disposed between an input terminal of analog-digital converter 103 and ground 204, and forms a filter unit 307 (low-pass filter) together with resistor R6. In this context, processing device 104 processes first potential-difference signal 201' and second potential-difference signal 202 in such a manner that a control signal 203 is provided at an output terminal S of processing device 104, which control signal has a high amplitude resolution and/or a high time resolution.

The following describes those components of control device 400 that are used to generate disconnect control signals. Such disconnect control signals are used to deactivate the entire circuit system when the measured voltages or differential voltages are outside of a specific range.

First potential-difference signal 201 output from first potential-difference detection device 101 is simultaneously supplied to four comparator units, i.e., to a first comparator unit 405, a second comparator unit 406, a third comparator unit 407, and a fourth comparator unit 408. Furthermore, four reference-voltage setting units are provided in control device 400, i.e., a first reference-voltage setting unit 401, a second reference-voltage setting unit 402, a third reference-voltage setting unit 403, and a fourth reference-voltage setting unit 404. These reference-voltage setting units are used to set specifically predefinable reference voltages, in order to monitor first potential-difference signal 201, which is output from first potential-difference detection device 101, with regard to its voltage values. First reference-voltage setting unit 401 outputs a threshold voltage signal, which corresponds to a maximum voltage at a positive input (HS voltage signal, see above). If first potential-difference signal 201 exceeds this maximum voltage, which is typically in a range between 150 to 300 V, a first disconnect control signal 409 is output. First reference-voltage setting unit 401 may be provided as a digital-analog converter having a resolution of 4 bits, such that an analog voltage in a range: of 150 to 300 V having a resolution of 10 V may be set.

Second reference-voltage setting unit 402, which defines a lower threshold voltage that the LS voltage signal terminal of actuator unit 301 may not fall below, operates in a manner similar to that of first reference-voltage setting unit 401. Such a threshold is provided in a range of −100 to 50 V at a resolution of 10 V, the threshold signal being supplied to second comparator unit 406. If such a threshold is exceeded, a second disconnect control signal 410 is output.

Third reference-voltage setting unit 403 is used to set a terminal voltage. To this end, first potential-difference signal 201 is compared to a reference terminal voltage output by third reference-voltage setting unit 403. If such a threshold is exceeded, a third disconnect control signal 411 is output from third comparator unit 407.

Like preceding reference-voltage setting units 401-403, fourth reference-voltage setting unit 404 is also designed as a digital-analog converter, which in contrast to the previously described digital-analog converters 401-403 has a resolution of 8 bits. In this manner, a threshold signal corresponding to −40 to 215 V is output at a resolution of 1 V, this signal being supplied to fourth comparator unit 408. In fourth comparator unit 408, this signal is compared to first potential-difference signal 201, in order to output a fourth disconnect control signal 412 from fourth comparator unit 408 if first potential-difference signal 201 is outside of a specifiable range.

First and second potential-difference signals 201 or 202 measured by first and second potential-difference detection devices 101 and 102, respectively, are made available on circuit components that are not able to detect a differential voltage independently.

The measurement of the differential voltage may take place via both voltage divider units 305 and 306, which have the same divider ratio in one specific embodiment of the present invention. The same voltage divider ratio may be used when the differential voltage is to be determined via first potential-difference detection device 101, while in second potential-difference detection device 102, different divider ratios may also be provided in first and second voltage divider units 305 and 306. In particular, one advantage of the present specific embodiment is that the differential voltage is ascertained in different manners such that the most exact measurement in each instance may be used. In particular, a higher time resolution is achieved using first potential-difference detection device 101 than is achieved using second potential-difference detection device 102, so that first potential-difference detection device 101 may be used if a higher time resolution is required for the measurement of the potential-difference.

On the other hand, second potential-difference detection device 102 has a higher amplitude resolution than first potential-difference detection device 101. Thus, second potential-difference detection device 102 is used to determine the differential voltage at actuator unit 30 in particular in cases in which a particularly exact determination of the amplitude of the differential voltage is critical.

Using the circuit system according to the present invention it is thus possible to detect an electric potential-difference 200 to be detected, which is applied at actuator units 301a-301n, with a high precision, both with regard to the time resolution and with regard to the amplitude resolution. By using different modules to simultaneously detect such a differential voltage, the measurement having the greatest precision may be used in each instance. Other measurements may be adjusted according to the measurement having the greatest precision. The differential voltage measurement explained in the above description may be used particularly advantageously in control devices for piezo common rail diesel systems having injectors with direct needle control.

Although the exemplary embodiments and/or exemplary methods of the present invention has been described above with reference to the exemplary embodiments, it is not limited thereto but rather is modifiable in many ways.

Also, the exemplary embodiments and/or exemplary methods of the present invention is not limited to the above-mention uses.

What is claimed is:

1. A circuit system for detecting a time-variable amplitude of at least one electric potential-difference to be detected, comprising:
   a first potential-difference detection device for detecting the at least one electric potential-difference and for outputting a first potential-difference signal;
   a second potential-difference detection device for detecting the at least one electric potential-difference and for outputting a second potential-difference signal;
   wherein the first potential-difference detection device has a higher time resolution than the second potential-difference detection device, and wherein the second potential-difference detection device has a higher amplitude resolution than the first potential-difference detection device, the circuit system selecting one of the first potential-difference signal and the second potential-difference signal, based on whichever potential-difference signal has a higher precision, and outputting a control signal using the selected potential-difference signal.

2. The circuit system of claim 1, wherein the first potential-difference detection device is configured to determine the first potential-difference signal in an analog manner.

3. The circuit system of claim 1, wherein the second potential-difference detection device is configured to determine the second potential-difference signal digitally.

4. The circuit system of claim 2, wherein an analog-digital converter is connected downstream from the first potential-difference detection device.

5. The circuit system of claim 1, wherein a processing device processes the first potential-difference signal and the second potential-difference signal to output the control signal, which has at least one of a high amplitude resolution and a high time resolution.

6. A method for detecting a time-variable amplitude of at least one electric potential-difference to be detected, the method comprising:
   detecting the at least one electric potential-difference using a first potential-difference detection device;
   outputting a first potential-difference signal from the first potential-difference detection device;
   detecting the at least one electric potential-difference using a second potential-difference detection device;
   outputting a second potential-difference signal from the second potential-difference detection device;
   selecting one of the first potential-difference signal and the second potential-difference signal, based on whichever potential-difference signal has a higher precision; and
   outputting a control signal using the selected potential-difference signal;
   wherein the first potential-difference detection device detects the electric potential-difference at a higher time resolution than the second potential-difference detection device, and wherein the second potential-difference detection device detects the electric potential-difference at a higher amplitude resolution than the first potential-difference detection device.

7. The method of claim 6, wherein the first potential-difference signal is determined in an analog manner using first potential-difference detection device.

8. The method of claim 6, wherein the second potential-difference signal is determined digitally using second potential-difference detection device.

9. The method of claim 8, wherein the first potential-difference signal and the second potential-difference signal are processed via a processing device to output the control signal, which has a high amplitude resolution and/or a high time resolution.

* * * * *